(12) United States Patent
Chang

(10) Patent No.: US 11,942,912 B2
(45) Date of Patent: Mar. 26, 2024

(54) AMPLIFIER WITH TUNABLE IMPEDANCE CIRCUIT

(71) Applicant: SKYWORKS SOLUTIONS, INC., Irvine, CA (US)

(72) Inventor: Weiheng Chang, Thousand Oaks, CA (US)

(73) Assignee: Skyworks Solutions, Inc., Irvine, CA (US)

(*) Notice: Subject to any disclaimer, the term of this patent is extended or adjusted under 35 U.S.C. 154(b) by 306 days.

(21) Appl. No.: 17/024,634

(22) Filed: Sep. 17, 2020

(65) Prior Publication Data

US 2021/0083636 A1 Mar. 18, 2021

Related U.S. Application Data

(60) Provisional application No. 62/902,303, filed on Sep. 18, 2019.

(51) Int. Cl.
*H03F 3/72* (2006.01)
*H03F 1/56* (2006.01)
*H03F 3/195* (2006.01)
*H03F 3/24* (2006.01)

(52) U.S. Cl.
CPC ............. *H03F 3/72* (2013.01); *H03F 1/565* (2013.01); *H03F 3/195* (2013.01); *H03F 3/245* (2013.01); *H03F 2200/294* (2013.01); *H03F 2200/451* (2013.01)

(58) Field of Classification Search
CPC .......... H03G 3/3042; H03G 2201/103; H03G 2201/307; H03F 3/245; H03F 2200/294; H03F 2200/451
USPC ........................................................ 330/278
See application file for complete search history.

(56) References Cited

U.S. PATENT DOCUMENTS

| 7,560,990 | B2* | 7/2009 | Lin | H03G 1/0088 |
| | | | | 330/296 |
| 2008/0012643 | A1* | 1/2008 | Duperray | H03F 3/191 |
| | | | | 330/284 |
| 2016/0336983 | A1* | 11/2016 | Wang | H04B 1/0458 |
| 2018/0175807 | A1* | 6/2018 | Noori | H03G 3/008 |
| 2018/0191312 | A1* | 7/2018 | Mu | H03F 1/342 |
| 2019/0267951 | A1* | 8/2019 | Kim | H03F 3/245 |
| 2019/0363690 | A1* | 11/2019 | Golat | H03F 3/19 |
| 2020/0328724 | A1* | 10/2020 | Ayranci | H03F 3/72 |
| 2022/0255520 | A1* | 8/2022 | Lee | H03G 3/3036 |

* cited by examiner

*Primary Examiner* — Hafizur Rahman
(74) *Attorney, Agent, or Firm* — Chang & Hale LLP

(57) ABSTRACT

This disclosure describes amplifiers that include impedance circuits that are configured to adapt to various contexts. For example, a variable-gain amplifier can include a gain circuit configured to amplify a signal and to operate in a plurality of gain modes, and an impedance circuit coupled to the gain circuit. The impedance circuit can include an inductor and a switching-capacitive arm coupled in parallel to the inductor. The impedance circuit can be configured to operate based at least in part on a gain mode from among the plurality of gain modes.

17 Claims, 13 Drawing Sheets

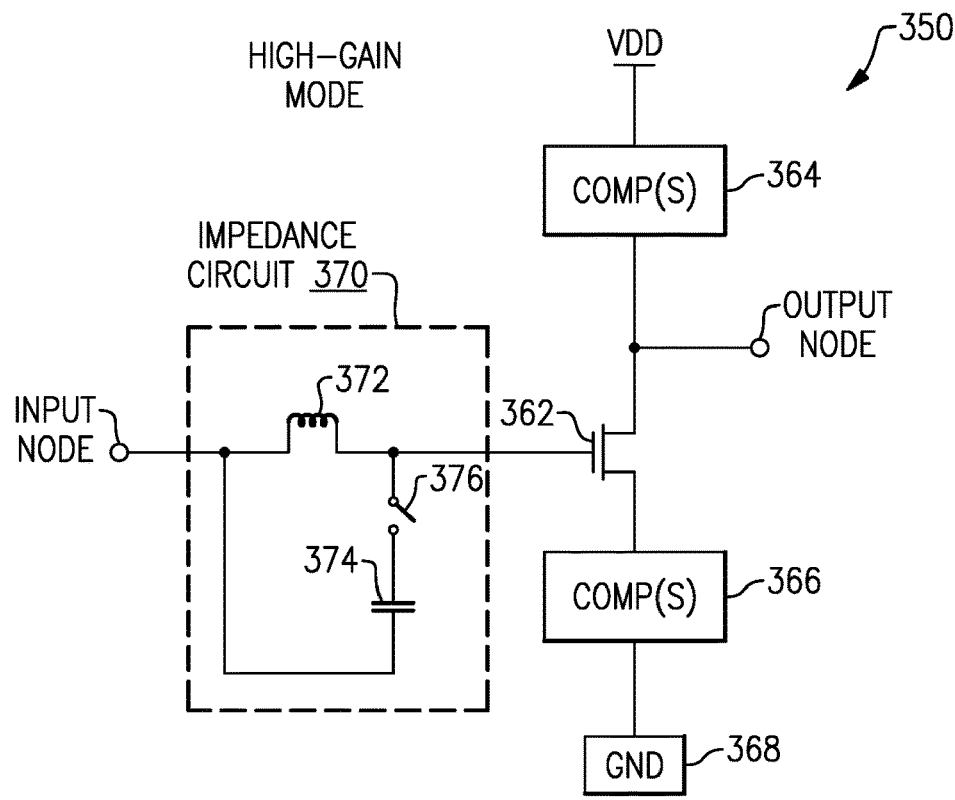
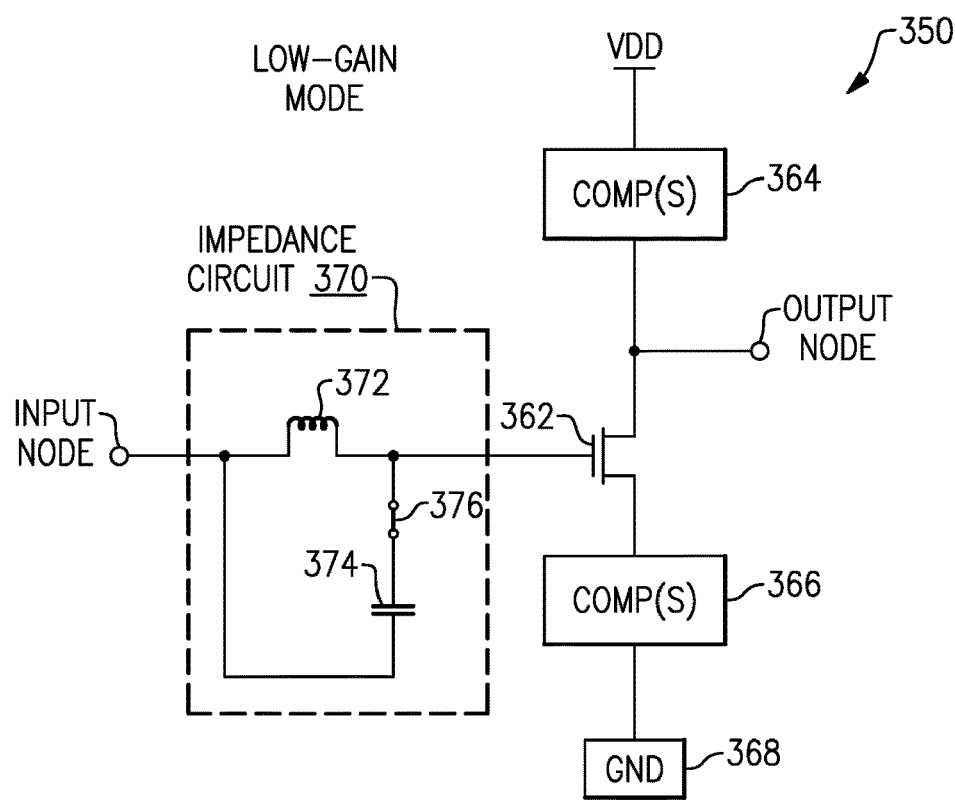

AMPLIFIER WITH TUNABLE IMPEDANCE CIRCUIT

CROSS-REFERENCE TO RELATED APPLICATIONS

This application claims priority to U.S. Provisional Application No. 62/902,303, filed Sep. 18, 2019 and entitled "Amplifier with Tunable Impedance Circuit," the entire contents of which are incorporated herein by reference.

BACKGROUND

Field

The present disclosure relates to the field of amplifiers.

Description of Related Art

Wireless communication devices often include a front-end module that is configured to amplify signals. For example, a front-end module can receive a signal via an antenna, use a low noise amplifier to amplify the signal to a desired level, and pass the amplified signal onto another component. Since the received signal can be associated with many signal strengths, the low noise amplifier can implement a variety of gain modes to provide an output signal that is associated with a relatively consistent signal level. To implement such gain modes, the front-end module includes many inductors and other components in a variety of configurations. These components and configurations occupy substantial area on the front-end module. Further, these components and configurations often include poor return loss in at least one mode of operation.

SUMMARY

In accordance with some implementations, the present disclosure relates to a variable-gain amplifier comprising: a gain circuit configured to amplify a signal and to operate in a plurality of gain modes, and an impedance circuit coupled to the gain circuit. The impedance circuit includes an inductor and a switching-capacitive arm coupled in parallel to the inductor. The impedance circuit is configured to operate based at least in part on a gain mode from among the plurality of gain modes.

In some embodiments, the switching-capacitive arm includes a capacitor and a switch coupled in series. The switch can include at least one of a transistor or a mechanical switch. Further, in some embodiments, the switching-capacitive arm is a first switching-capacitive arm and the impedance circuit further includes a second switching-capacitive arm coupled in parallel to the inductor.

In some embodiments, the gain circuit includes a transistor having a gate or a base coupled to an input node and a drain or a collector coupled to an output node, and the impedance circuit is coupled to the gate or the base of the transistor. Further, in some embodiments, the variable-gain amplifier is implemented within a low noise amplifier.

In accordance with some implementations, the present disclosure relates to an amplifier comprising: a transistor including a gate or a base coupled to an input node and a drain or a collector coupled to an output node, and a circuit coupled to the gate or the base of the transistor. The circuit can include an inductor and a switching-capacitive arm coupled in parallel to the inductor.

In some embodiments, the switching-capacitive arm is configured to operate in a closed state when the amplifier is operating in a first gain mode and is configured to operate in an open state when the amplifier is operating in a second gain mode. The first gain mode can be associated with less gain than the second gain mode.

In some embodiments, the switching-capacitive arm includes a capacitor and a switch coupled in series. The switch can include a transistor and/or a mechanical switch. Further, in some embodiments, the variable-gain circuit is implemented within a low noise amplifier and the transistor is implemented as a field-effect transistor. Moreover, in some embodiments, the amplifier can further comprise a degeneration circuit coupled to a source or an emitter of the transistor. The degeneration circuit can include at least one inductor.

In accordance with some implementations, the present disclosure relates to a radio-frequency module comprising: a low noise amplifier configured to amplify a first signal, a power amplifier configured to amplify a second signal, and a controller coupled to at least one of the low noise amplifier or the power amplifier. The controller is configured to select one of a plurality of gain modes for the radio-frequency module. At least one of the low noise amplifier or the power amplifier includes a transistor and an impedance circuit. The transistor includes a gate or a base coupled to an input node and a drain or a collector coupled to an output node. The impedance circuit is coupled to the gate or the base of the transistor. The impedance circuit includes an inductor and a switching-capacitive arm coupled in parallel to the inductor.

In some embodiments, the controller is configured to place the switching-capacitive arm in an open state in response to selecting a first gain mode of the plurality of gain modes and place the switching-capacitive arm in a closed state in response to selecting the second gain mode. The first gain mode can be associated with more gain than the second gain mode.

In some embodiments, the switching-capacitive arm includes a capacitor and a switch coupled in series. Further in some embodiments, the switching-capacitive arm is a first switching-capacitive arm and the impedance circuit further includes a second switching-capacitive arm coupled in parallel to the inductor.

In some embodiments, the low noise amplifier includes the transistor and the impedance circuit. Further in some embodiments, the power amplifier includes the transistor and the impedance circuit.

In accordance with some implementations, the present disclosure relates to a radio-frequency device comprising: a low noise amplifier configured to amplify a first signal, a power amplifier configured to amplify a second signal, a controller coupled to at least one of the low noise amplifier or the power amplifier, and an antenna configured to receive the first signal and transmit the second signal. The controller is configured to select one of a plurality of gain modes for the radio-frequency device. At least one of the low noise amplifier or the power amplifier includes a transistor and an impedance circuit. The transistor includes a gate or a base coupled to an input node and a drain or a collector coupled to an output node. The impedance circuit is coupled to the gate or the base of the transistor. The impedance circuit includes an inductor and a switching-capacitive arm coupled in parallel to the inductor.

In some embodiments, the controller is configured to set the switching-capacitive arm to an open state in response to selecting a first gain mode of the plurality of gain modes and set the switching-capacitive arm to a closed state in response to selecting the second gain mode. The first gain mode can be associated with more gain than the second gain mode.

In some embodiments, the switching-capacitive arm includes a capacitor and a switch coupled in series. Further, in some embodiments, the switching-capacitive arm is a first switching-capacitive arm and the impedance circuit further includes a second switching-capacitive arm coupled in parallel to the inductor.

For purposes of summarizing the disclosure, certain aspects, advantages, and/or features of the disclosure have been described. It is to be understood that not necessarily all such advantages may be achieved in accordance with any particular embodiment of the disclosure. Thus, the disclosure may be embodied or carried out in a manner that achieves or optimizes one advantage or group of advantages as taught herein without necessarily achieving other advantages as may be taught or suggested herein.

BRIEF DESCRIPTION OF THE DRAWINGS

Various embodiments are depicted in the accompanying drawings for illustrative purposes and should in no way be interpreted as limiting the scope of the disclosure. In addition, various features of different disclosed embodiments can be combined to form additional embodiments, which are part of this disclosure. Throughout the drawings, reference numbers may be reused to indicate correspondence between reference elements.

FIG. 4A illustrates the amplifier of FIG. 3 configured to operate in a high-gain mode in accordance with one or more embodiments.

FIG. 4B illustrates the amplifier of FIG. 3 configured to operate in a low-gain mode in accordance with one or more embodiments.

DETAILED DESCRIPTION

This disclosure is directed to, in part, amplifiers that include impedance circuits that are configured to adapt to various contexts. For example, a variable-gain amplifier can operate in a plurality of gain modes to amplify a signal with different levels of amplification. The variable-gain amplifier can include a gain circuit configured to amplify a signal and an impedance circuit coupled to the gain circuit, such as coupled to an input node for the gain circuit. The impedance circuit can include an inductor and a switching-capacitive arm coupled in parallel to the inductor. The impedance circuit can operate based on a current gain mode to change an impedance for the variable-gain amplifier. For example, the switching-capacitive arm can be controlled to change an input inductance for the different gain modes of the variable-gain amplifier. The switching-capacitive arm can include one or more capacitors and/or one or more switches configured to enable or disable the one or more capacitors.

In embodiments, the techniques and architectures discussed herein provide a tunable circuit that is configured to adapt an input impedance for a particular context, such as a gain mode, operating frequency, wireless system, or other operation mode. For example, an amplifier can include a switching-capacitive arm that is coupled to an input side of the amplifier and that is tunable to provide a desired impedance. The switching-capacitive arm can be adapted to match an output impedance and/or provide a desired return loss (e.g., an S11 parameter) for various modes of operation of the amplifier. As such, the techniques and architectures discussed herein can improve return loss, in comparison to other solutions that include poor return loss in at least one mode of operation. Further, in some embodiments, by implementing one or more capacitors in a switching-capacitive arm, which occupy less area than one or more inductors, the techniques and architectures discussed herein can conserve area on a device (e.g., a front-end module, semiconductor die, or other device), in comparison to implementing many inductors in various configurations.

Although many embodiments are discussed herein in the context of variable-gain amplifiers, the techniques and architectures can be implemented in a wide variety of contexts, such as any type of amplifier or circuit.

Figure 1:
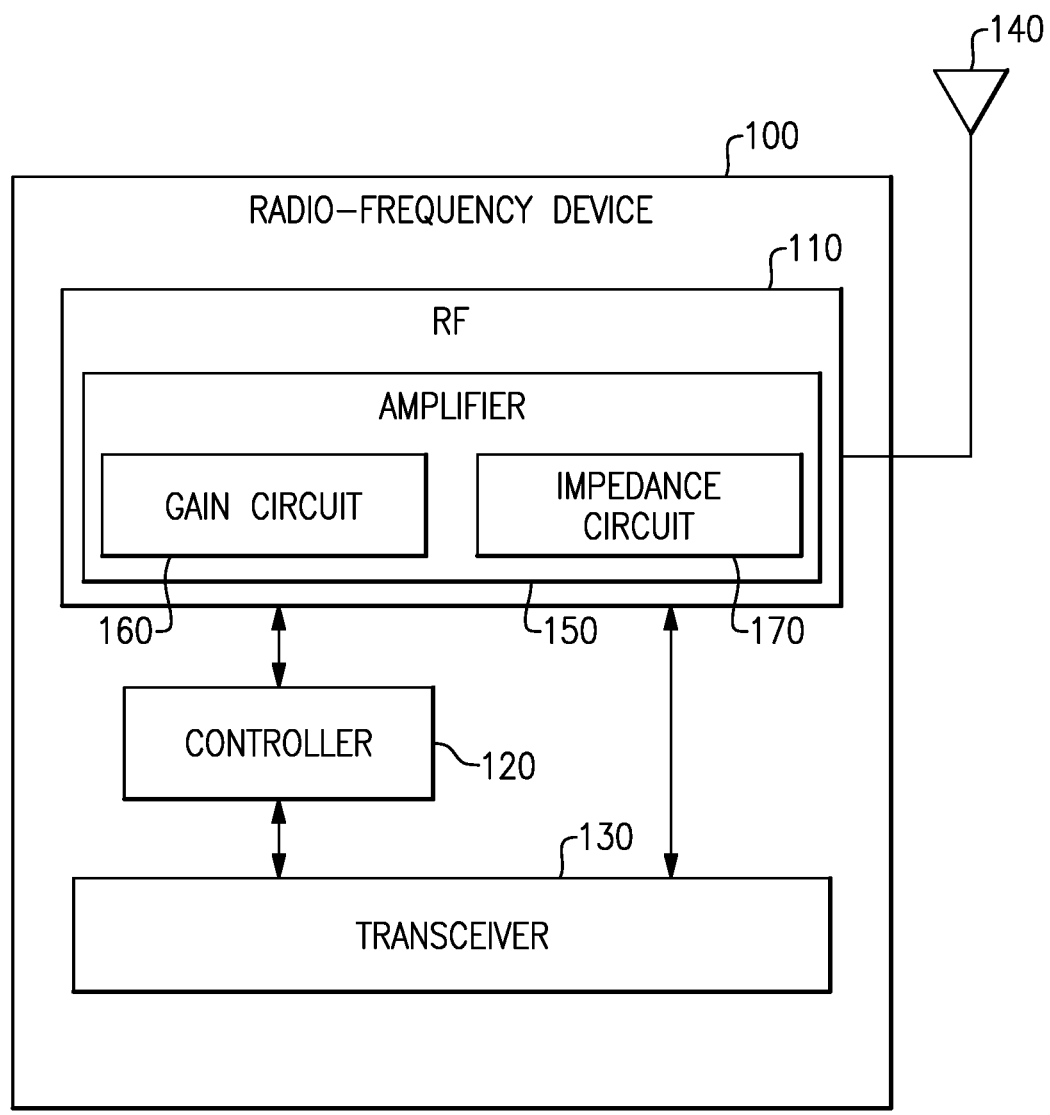
FIG. 1 illustrates an example radio-frequency device having various features relevant to certain aspects of the present disclosure.

FIG. 1 illustrates an example radio-frequency device 100 having various features relevant to certain aspects of the present disclosure. The radio-frequency device 100 includes an RF module 110, a transceiver 130, a controller 120, and an antenna 140. The transceiver 130 can be configured to convert between analog signals and digital signals. The transceiver 130 can include a digital-to-analog converter, an analog-to-digital converter, a local oscillator for modulating or demodulating a baseband signal to or from a carrier frequency, a baseband processor that converts between digital samples and data bits (e.g., voice or other types of data), or other components. The RF module 110 can perform processing on an analog signal received from on an antenna 140 or received from the transceiver 130. The RF module 110 can include filters, power amplifiers, low noise amplifiers, band select switches, attenuators, matching circuits, and/or other components. In some embodiments, the RF module 110 can be referred to as a front-end module (FEM), which can be physically close to the antenna 140 (e.g., to reduce attenuation to cable loss). The controller 120 can communicate with the transceiver 130 and/or the RF module 110 to facilitate various functionality discussed herein.

The RF module 110 can include an amplifier 150 configured to amplify signals received and/or sent via the antenna 140. The amplifier 150 can include a gain circuit 160 configured to amplify a signal received at the amplifier 150 and an impedance circuit 170 that is configured to change an impedance (e.g., input inductance) based on a gain mode of the amplifier 150 and/or another parameter. In examples, the amplifier 150 can include a variable-gain amplifier configured to provide a plurality of gain modes. To illustrate, the amplifier 150 can be configured to provide a first amplification gain for a first gain mode, a second amplification gain for a second mode, a third amplification gain for a third mode, and so on. The controller 120 can control a gain mode of the amplifier 150, an impedance selected for the impedance circuit 170, and/or an impedance selected for a degeneration circuit (discussed in further detail below). For example, the controller 120 can provide a control signal to the amplifier 150 to control an amount of gain provided by the amplifier 150, control an amount of impedance of the impedance circuit 170, and/or control an amount of impedance of a degeneration circuit.

In some embodiments, the impedance circuit 170 can be controlled to provide noise matching (e.g., ideal noise matching), gain matching, or other types of impedance matching at any frequency(ies) of interest. The impedance circuit 170 can allow the amplifier 150 to be coupled to a desired or target input inductance for particular gain modes and/or signal amplitudes. For example, the amplifier 150 can implement the impedance circuit 170 with a first configuration to provide an impedance-matched circuit for a first gain mode and implement the impedance circuit 170 with a second configuration to provide an impedance-matched circuit for a second gain mode. This can provide a desired return loss (e.g., a relatively good S11 parameter) for various modes of operation of the amplifier 150. As such, the amplifier 150 can achieve targeted or improved performance (in comparison to other amplifiers) by using the impedance circuit 170 that is configurable to provide tailored impedance for different gain modes.

The controller 120 can be configured to generate and/or send control signals to components of the radio-frequency device 100. In examples, the controller 120 can send a control signal to the amplifier 150 to control a gain mode of the amplifier 150. For example, the controller 120 can provide a control signal to the amplifier 150 indicative of a desired or targeted gain. Each gain mode can be associated with a different amount of amplification. Further, in examples, the controller 120 can send a control signal to the amplifier 150 to configure an impedance of the amplifier 150 (e.g., to set a configuration of the impedance circuit 170). For example, the controller 120 can provide a control signal to the amplifier 150 indicative of a desired or targeted input inductance.

In some embodiments, the controller 120 generates a control signal based on a quality of service (QoS) metric associated with a signal. A QoS metric can include a metric associated with a signal(s) received or sent via the antenna 140, such as a signal strength, a bit error rate, a data throughput, a transmission delay, a signal-to-to-noise ratio, or any other metric. In some embodiments, the controller 120 can be configured to receive a signal from a component of the radio-frequency device 100 and determine a control signal to provide to another component based on the received signal. For example, the controller 120 can generate a control signal based on a signal received from a communications controller, which can be based on a QoS metric of a received signal. In some embodiments, the controller 120 provides control signals based on specifications provided by the mobile industry processer interface alliance (MIPI® Alliance).

In some embodiments, the amplifier 150 can include a step-variable gain amplifier configured to amplify received signals with a gain of one of a plurality of configured amounts indicated by a control signal. Further, in some embodiments, the amplifier 150 can include a continuously-variable gain amplifier configured to amplify received signals with a gain proportional to or dictated by a control signal. Moreover, in some embodiments, the amplifier 150 can include a step-variable current amplifier configured to amplify received signals by drawing a current of one of plurality of configured amounts indicated by a control signal. Furthermore, in some embodiments, the amplifier 150 can include a continuously-variable current amplifier configured to amplify received signals by drawing a current proportional to a control signal.

In some embodiments, the antenna 140 includes a primary antenna and a diversity antenna. The primary antenna and the diversity antenna can be physically spaced apart such that a signal at the primary antenna and the diversity antenna are received with different characteristics. For example, the primary antenna and the diversity antenna can receive the signal with different attenuation, noise, frequency response, and/or phase shift. The transceiver 130 can use both of the signals with different characteristics to determine data bits corresponding to the signal. In some implementations, the transceiver 130 selects between the primary antenna and the diversity antenna based on the characteristics, such as selecting the antenna with the highest signal-to-noise ratio. In some embodiments, the transceiver 130 combines signals from the primary antenna and the diversity antenna to increase the signal-to-noise ratio of the combined signal. In some embodiments, the transceiver 130 processes the signals to perform multiple-input/multiple-output (MIMO) communication. As noted above, in some embodiments, the diversity antenna can be physically spaced apart from the primary antenna. Here, the diversity antenna can be coupled to the transceiver 130 by a transmission line, such as a cable, a printed circuit board (PCB) trace, or another component. In examples, the transmission line is lossy and/or attenuates the signal received at the diversity antenna before it reaches the transceiver 130.

In some embodiments, the antenna 140 is configured to receive signals within multiple cellular frequency bands and/or wireless local area network (WLAN) frequency bands. In such embodiments, the radio-frequency device 100 can include a multiplexer, switching network, and/or filter assembly coupled to a diversity antenna that is configured to separate the diversity signal into different frequency ranges. For example, the multiplexer can be configured to include a low pass filter that passes a frequency range that includes low band cellular frequencies, a bandpass filter that passes a frequency range that includes low band WLAN signals and mid-band and high-band cellular signals, and a high pass filter that passes a frequency range that includes high-band WLAN signals. As another example, the multiplexer can have a variety of different configurations such as a diplexer that provides the functionality of a high pass filter and a low pass filter.

The amplifier 150 can be implemented within a low noise amplifier (LNA), a power amplifier (PA), and/or any other component. For example, the RF module 110 can include an LNA configured to receive a signal from the antenna 140 and amplify the signal using the amplifier 150. In some embodiments, multiple variable-gain amplifiers are implemented on the radio-frequency device 100. For example, a first module can be implemented with a first variable-gain amplifier to amplify a signal from a diversity antenna and a second module can be implemented with a second variable-gain amplifier to amplify a signal from a primary antenna. In examples, a module associated with a diversity antenna can be referred to as a diversity receiver front-end module and/or can be located physically close to the diversity antenna.

Figure 2:
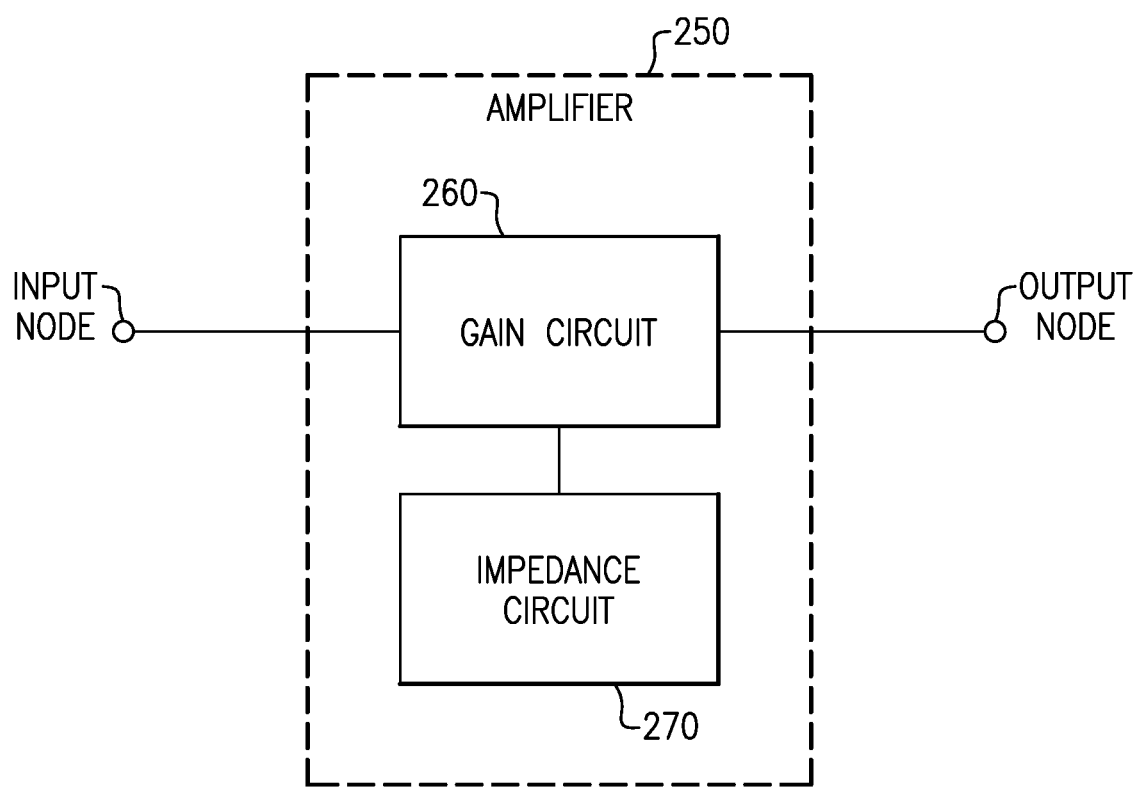
FIG. 2 illustrates an example amplifier that includes a gain circuit coupled to an impedance circuit in accordance with one or more embodiments.

FIG. 2 illustrates an example amplifier 250 that includes a gain circuit 260 coupled to an impedance circuit 270 in accordance with one or more embodiments. The gain circuit 160 can be configured to receive an input signal and to generate an amplified output signal. For example, the amplifier 250 can receive an input signal via the input node, amplify the signal using the gain circuit 260, and provide an amplified output signal via the output node. The impedance circuit 270 can be configured to provide a plurality of different impedances for the gain circuit 260. In some embodiments, the amplifier 250 is implemented as a variable-gain amplifier and a selected impedance is based on a gain mode of the amplifier 250. For example, the impedance circuit 270 can be configured to provide a first impedance for a first gain mode, a second impedance for a second gain mode, a third impedance for a third gain mode, and so on.

Figure 3:
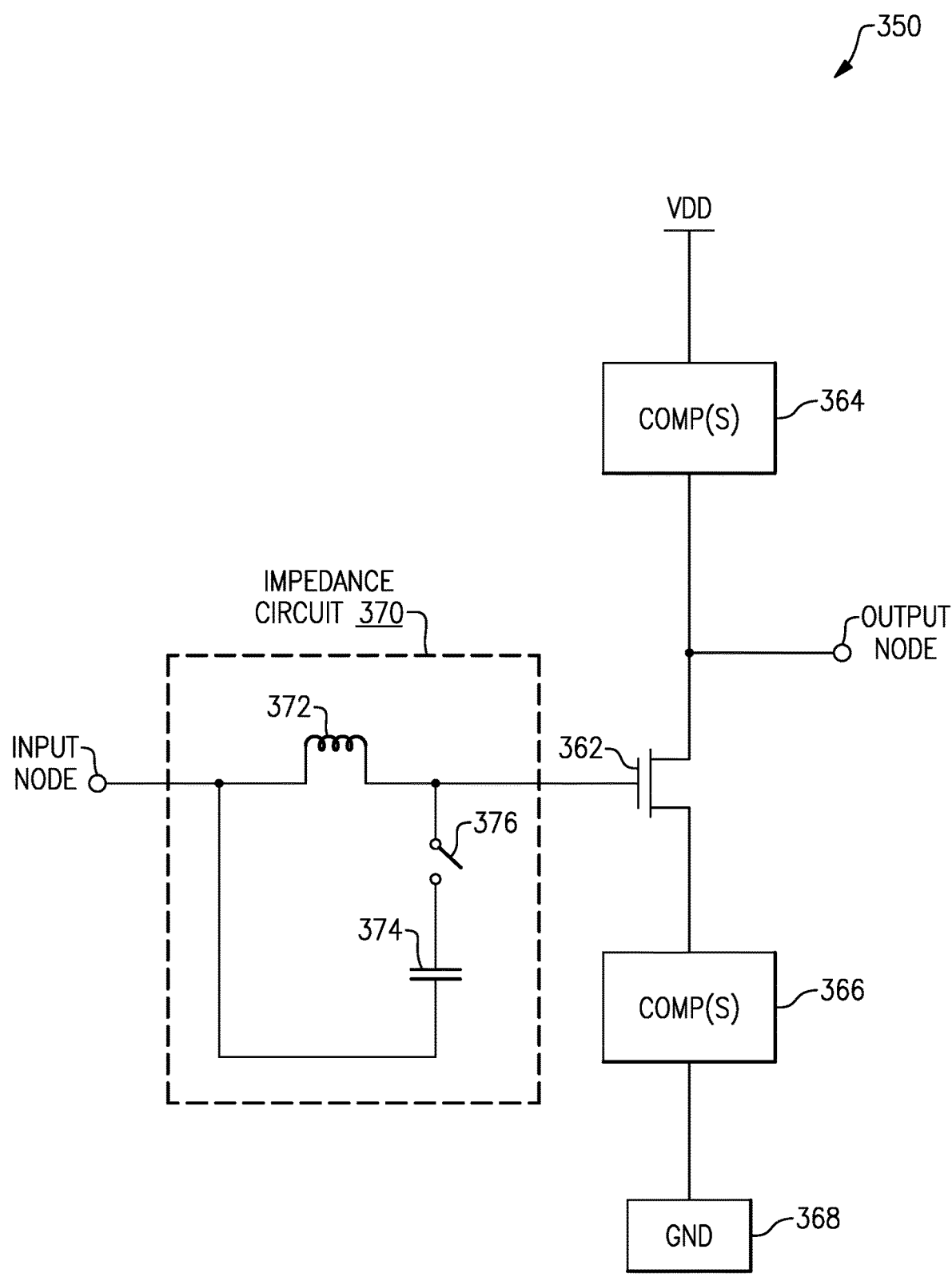
FIG. 3 illustrates an example amplifier that includes a gain circuit and an impedance circuit in accordance with one or more embodiments.

FIG. 3 illustrates an example amplifier 350 that includes a gain circuit and an impedance circuit 370 in accordance with one or more embodiments. Here, the amplifier 350 can receive an input signal at an input node and provide an output signal at an output node. The amplifier 350 includes a transistor 362 that can amplify the input signal, such as based on a gain mode that is selected. The transistor 362 includes a gate or a base coupled to the input node and the impedance circuit 370, a drain or a collector coupled to the output node and one or more components 364, and a source or an emitter coupled to one or more components 366. The transistor 362 can be coupled to a ground pad 368 via the one or more components 366. The ground pad 368 can be configured to connect to a ground or other voltage potential. The example of FIG. 3 illustrates the amplifier 350 configured as a common-source amplifier. However, the amplifier 350 can be implemented in other configurations. The one or more components 364 and/or the one or more components 366 can include one or more inductors, one or more capacitors, one or more transistors, or other components. Although illustrated in FIG. 3, in some embodiments the one or more components 364 and/or the one or more components 366 can be eliminated. The transistor 362, the one or more components 364, the one or more components 366, and/or a supply voltage (labeled "VDD") can be referred to as the gain circuit. However, in some embodiments, one or more components of the impedance circuit 370 can additionally, or alternatively, be part of the gain circuit.

The transistor 362 can be implemented as a single device or multiple devices, such as multiple transistors in a cascoded configuration. The transistor 362 can include a field-effect transistor (FET) (e.g., N-type or P-type device), such as a junction FET (JFET), insulated gate FET (e.g., a metal-oxide-semiconductor FET (MOSFET), a complementary metal-oxide-semiconductor (CMOS), etc.), and so on. Further, the transistor 362 can include a Bipolar junction transistor (BJT) (e.g., an NPN transistor, a PNP transistor, etc.), such as a heterojunction bipolar transistors (HBT), etc. For ease of illustration, the transistor 362 is shown in many examples as an FET, such as an n-type (or p-type) MOSFET. However, the transistor 362 can be implemented as any type of transistor.

The impedance circuit 370 (sometimes referred to as the "input matching circuit 370") can include an inductor 372 and a switching-capacitive arm coupled in parallel to the inductor 372. Although the inductor 372 is illustrated in FIG. 3, in some embodiments another component is used, such as one or more capacitors, one or more resistors, one or more transistors, and so on. The switching-capacitive arm can include a capacitor 374 and a switch 376 coupled in series, as illustrated. Although a single capacitor and a single switch are illustrated in FIG. 3, any number of capacitors and/or switches can be implemented in parallel or series with each other and/or the inductor 372. In some embodiments, multiple switching-capacitive arms are implemented in parallel, such as that illustrated in FIG. 8.

The transistor 376 can be implemented as a wide variety of switches, such as voltage-controlled switches, current-controlled switches, etc. For example, the switch 376 can be implemented as a transistor, a mechanical switch, etc. A transistor can include a field-effect transistor (FET) (e.g., N-type or P-type device), such as a junction FET (JFET), insulated gate FET (e.g., a metal-oxide-semiconductor FET (MOSFET), a complementary metal-oxide-semiconductor (CMOS), etc.), and so on. Further, a transistor can include a Bipolar junction transistor (BJT) (e.g., an NPN transistor, a PNP transistor, etc.), such as a heterojunction bipolar transistors (HBT), etc.

In embodiments, the amplifier 350 can be configured to operate in a plurality of gain modes (e.g., the amplifier 350 is implemented as a variable-gain amplifier). Each gain mode can be associated with a different amount of gain. For example, an input signal can be amplified by a first amount of amplification when the amplifier 350 is configured in a first gain mode, an input signal can be amplified by a second amount of amplification that is different than the first amount of amplification when the amplifier 350 is configured in a second gain mode, and so on. To set a gain mode, a controller (not illustrated) can provide a control signal to the amplifier 350 or another component to set the amplifier 350 to the gain mode. In some embodiments, the supply voltage (labeled "VDD") can be configured to set a gain mode of the amplifier 350. For example, the supply voltage can be controlled to provide a first voltage for a first gain mode, provide a second voltage for a second gain mode, and so on.

The impedance circuit 370 can be configured based on a gain mode. In particular, a configuration of the switching-capacitive arm of the impedance circuit 370 can be adjusted based on a gain mode in which the amplifier 350 is operating. For example, in a first gain mode, the switch 376 can be placed in a closed state to allow a current to pass through the capacitor 374 (e.g., a closed circuit configuration), and in a second gain mode, the switch 376 can be placed in an open state to prevent a current from passing through the capacitor 374 (e.g., an open circuit configuration). By changing the configuration of the switching-capacitive arm, the amplifier 350 can change an impedance (e.g., inductance) for the amplifier 350 to provide a particular performance characteristic, such as to match an input impedance to an output impedance for multiple modes of operation. Further, by implementing the capacitor 374, instead of inductors in a variety of configurations, the amplifier 350 can efficiently use area on a device. In some embodiments, an inductor can occupy an area that is ten times (or more) larger than an area occupied by capacitor. As such, the amplifier 350 can substantially reduce an area needed to implement an amplifier that is configured to provide multiple gain modes.

FIGS. 4A-4B illustrate example configurations of the amplifier 350 of FIG. 3 for multiple gain modes in accordance with one or more embodiments. In particular, FIG. 4A illustrates the amplifier 350 configured to operate in a high-gain mode, while FIG. 4B illustrates the amplifier 350 configured to operate in a low-gain mode. Although particular configurations are illustrated for the amplifier 350 in FIGS. 4A-4B, the configurations can be swapped and/or other configurations can be used. Further, although configurations are illustrated for two gain modes in FIGS. 4A-4B, any number of gain modes can be implemented with any number of configurations and/or levels of amplification.

A high-gain mode can generally be associated with more amplification than a low-gain mode. In one example, a high-gain mode can be associated with more than a first threshold of amplification, while a low-gain mode can be associated with less than the first threshold of amplification or less than a second threshold of amplification that is less than the first threshold of amplification. For instance, a high-gain mode can be associated with more than 20 dB of amplification, while a low-gain mode can be associated with less than 20 dB of amplification.

In a high-gain mode, as illustrated in FIG. 4A, the switching-capacitive arm of the impedance circuit 370 can be set to an open circuit configuration. In particular, the switch 376 is implemented with an open state so that the switching-capacitive arm is viewed as an open circuit (e.g., current passes through just the arm with the inductor 372). Here, the inductance of the impedance circuit 370 is lower, since the switching-capacitive arm with the capacitor 374 is not a conducting path. In contrast, in a low-gain mode, as illustrated in FIG. 4B, the switching-capacitive arm of the impedance circuit 370 is set to a closed-circuit configuration. In particular, the switch 376 is implemented with a closed state so that the switching-capacitive arm is viewed as a closed circuit (e.g., current passes through the arm with the inductor 372 and the switching-capacitive arm). Here, the inductance of the impedance circuit 370 is higher, since the switching-capacitive arm with the capacitor 374 is now a conducting path.

In some embodiments, an amplifier, such as any of the amplifiers discussed herein, can provide a plurality of gain modes for a variety of purposes. For example, multiple gain modes can be used to convert received signals of different signal strengths to a relatively consistent signal strength (e.g., to a specific value or within a threshold to a specific value). To illustrate, multiple gain modes can be utilized to amplify received signals as a first radio-frequency device changes location relative to a second radio-frequency device and a signal strength of the received signals communicated between the first and second radio-frequency devices changes. In particular, an amplifier can use a first gain mode when the first radio-frequency device is a first distance from the second radio-frequency device and use a second gain mode when the first radio-frequency device is a second distance from the second radio-frequency device.

Figure 4C:
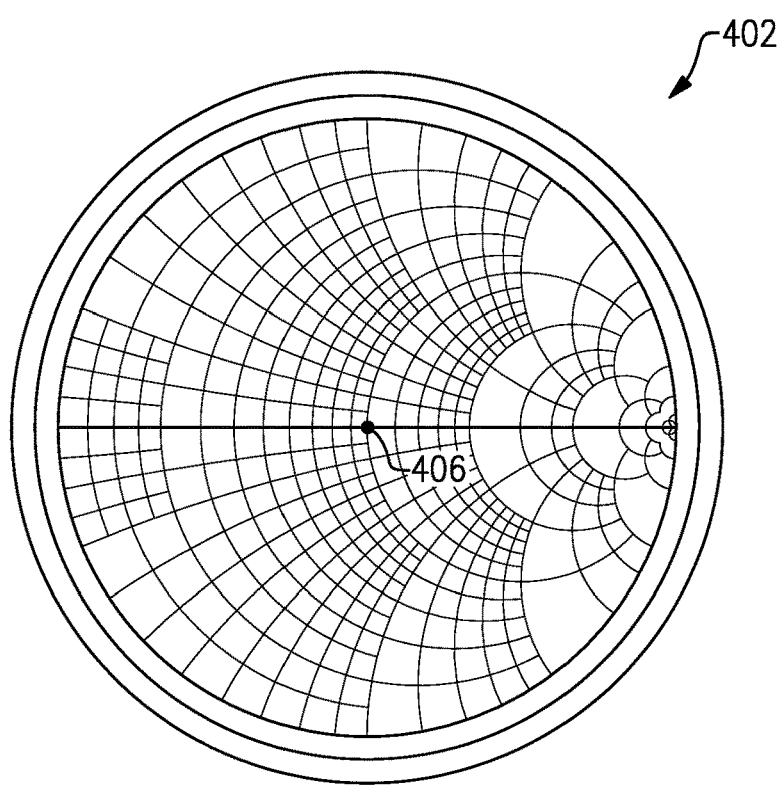
FIG. 4C illustrates an example smith chart to show characteristics of the amplifier of FIG. 4A that is configured to operate in a high-gain mode in accordance with one or more embodiments.

FIG. 4C illustrates an example smith chart 402 to show characteristics of the amplifier 350 of FIG. 4A that is configured to operate in a high-gain mode in accordance with one or more embodiments. The impedance circuit 370 can be implemented in an open state for the high-gain mode to provide a matched circuit, as illustrated by a point 406 in FIG. 4C. The point 406 represents a Z value (e.g., impedance) of 1. As such, the amplifier 350 can provide a desired return loss (e.g., a relatively good S11 parameter) when operating in the high-gain mode.

Figure 4D:
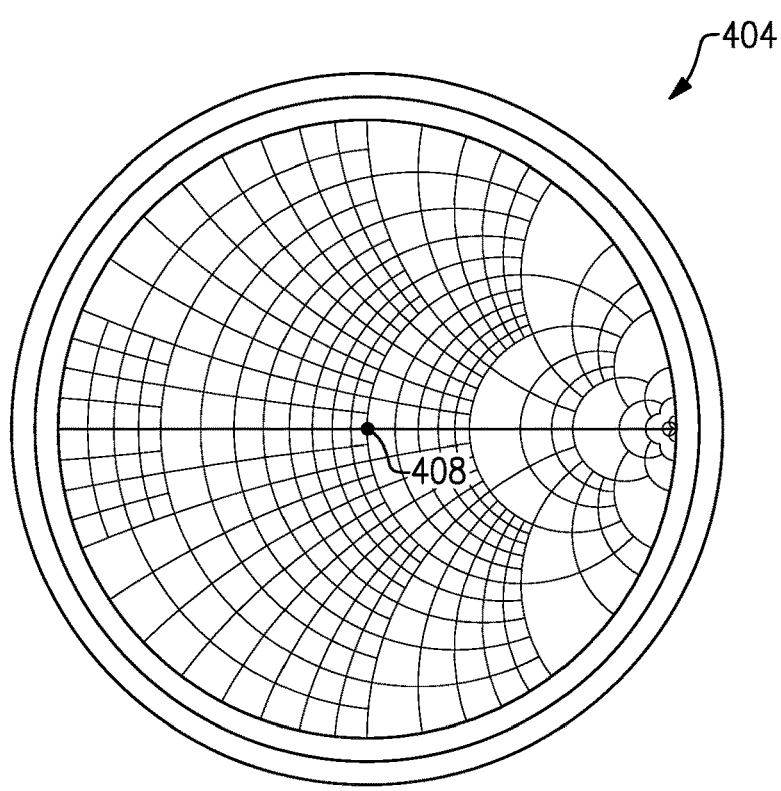
FIG. 4D illustrates an example smith chart to show characteristics of the amplifier of FIG. 4B that is configured to operate in the low-gain mode in accordance with one or more embodiments.

FIG. 4D illustrates an example smith chart 404 to show characteristics of the amplifier 350 of FIG. 4B that is configured to operate in the low-gain mode in accordance with one or more embodiments. The impedance circuit 370 can be implemented in a closed state for the low-gain mode to provide a matched circuit, as illustrated by a point 408 in FIG. 4D. The point 408 represents a Z value (e.g., impedance) of 1. As such, the amplifier 350 can provide a desired return loss (e.g., a relatively good S11 parameter) when operating in the low-gain mode.

Figure 5:
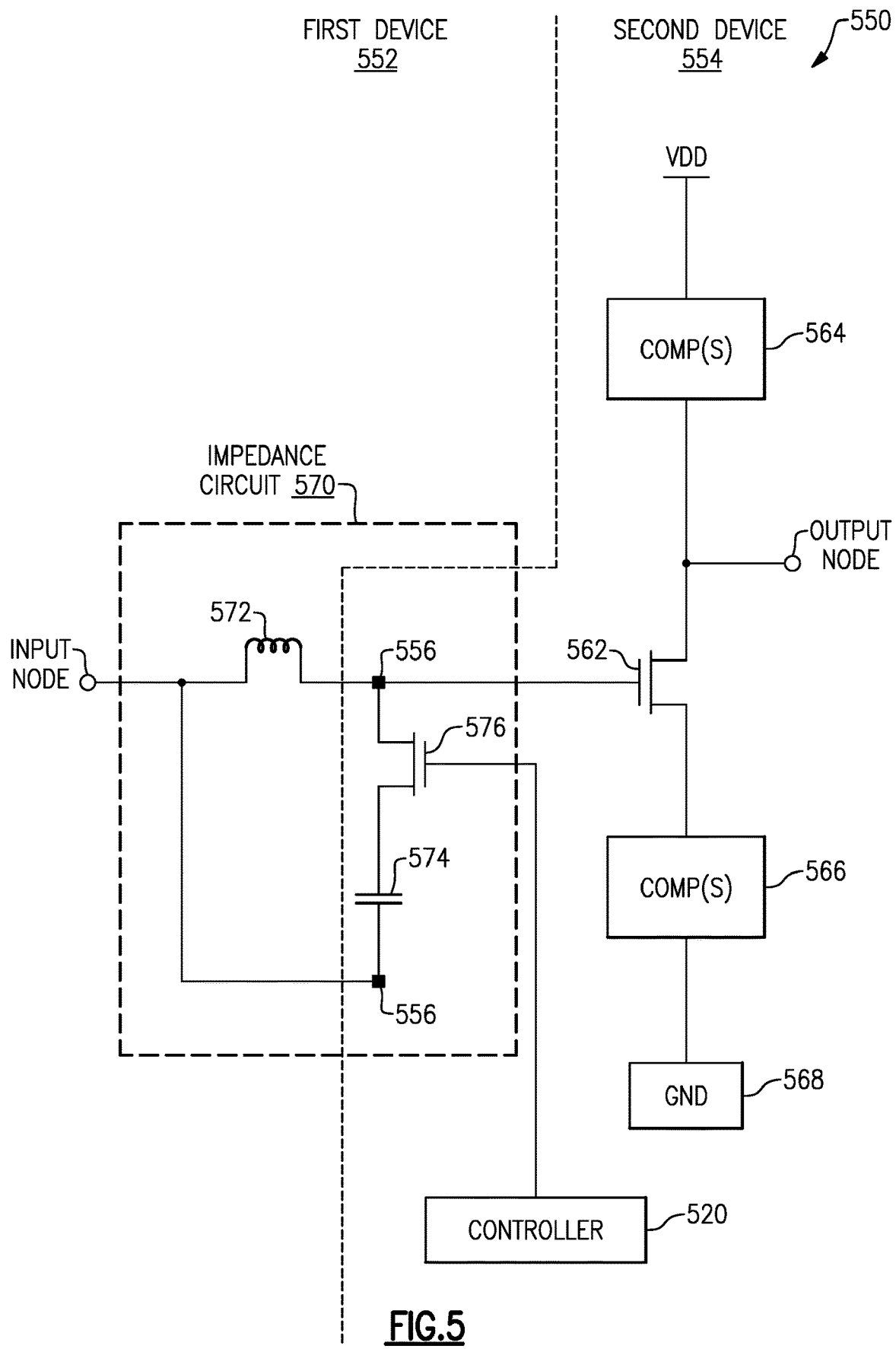
FIG. 5 illustrates an example amplifier with an impedance circuit that includes a transistor implemented as a switch in accordance with one or more embodiments.

FIG. 5 illustrates an example amplifier 550 with an impedance circuit 570 that includes a transistor 576 implemented as a switch in accordance with one or more embodiments. Here, the amplifier 550 can receive an input signal at an input node and provide an output signal at an output node. The amplifier 550 includes a transistor 562 to amplify the input signal. The transistor 562 includes a gate or a base coupled to the input node and the impedance circuit 570, a drain or a collector coupled to the output node and one or more components 564, and a source or an emitter coupled to one or more components 566. The transistor 562 can be coupled to a ground pad 568 via the one or more components 566. The one or more components 564 and/or the one or more components 566 can include one or more inductors, one or more capacitors, one or more transistors, or other components. In some embodiments, the amplifier 550 is implemented as a variable-gain amplifier configured for different gain modes.

The impedance circuit 570 can include an inductor 572 and a switching-capacitive arm coupled in parallel to the inductor 572. The switching-capacitive arm can include a capacitor 574 and the transistor 576 coupled in series, as illustrated. Although a single capacitor and a single transistor are illustrated in FIG. 5, any number of capacitors and/or transistors can be implemented in parallel or series with each other and/or the inductor 572. In this example, the transistor 576 is implemented to enable or disable the switching-capacitive arm (e.g., the capacitor 574). Here, a controller 520 is coupled to a gate of the transistor 576 to control the transistor 576 by placing the transistor 576 in an open state (e.g., off state) or closed state (e.g., on state). In particular, the controller 520 can provide a control signal, such as a voltage or current signal, to bias the transistor 576. In some embodiments, the controller 520 also provides a control signal to a supply voltage component to set a supply voltage. While in other embodiments, a separate controller is implemented to communicate with the supply voltage component. Although the controller 520 is shown outside the impedance circuit 570, in some embodiments the controller 520 is part of the impedance circuit 570.

In some embodiments, the amplifier 550 is implemented with some components located on a first device 552 and some components located on a second device 554, where the first device 552 can connect to the second device 554 at pads 556. In some embodiments, the pads 556 are part of the second device 554, as illustrated in FIG. 5, while in other embodiments the pads 556 are part of the first device 552 or a combination of the second device 554 and the first device 552. In the example of FIG. 5, the input node and the inductor 572 are located on the first device 552 and the one or more components 564, the one or more components 566, the ground pad 568, the transistor 562, the transistor 576, and the capacitor 574 are located on the second device 554. However, the components of the amplifier 550 can be arranged in a variety of manners on the first and second devices 552 and 554. For example, the input node, the output node, the inductor 572, the one or more components 564, the one or more components 566, the ground pad 568, the transistor 562, the transistor 576, and/or the capacitor 574 can be arranged on a same device or multiple devices in a variety of configurations (e.g., two, three, four, etc. dies). Each of the first device 552 and the second device 554 can include a die, a substrate, a module, or any other medium or element configured to implement components.

The inductor 572 and/or the capacitor 574 can have a variety of values. In some embodiments, the inductor 572 can have an inductance of 1 nH to 30 nH and the capacitor can have a capacitance of 100 fF to 100 pF. Although other inductance or capacitance values can be implemented. In some embodiments, the inductor 572 includes a fixed value (e.g., the inductor 572 is not variable).

Figure 6:
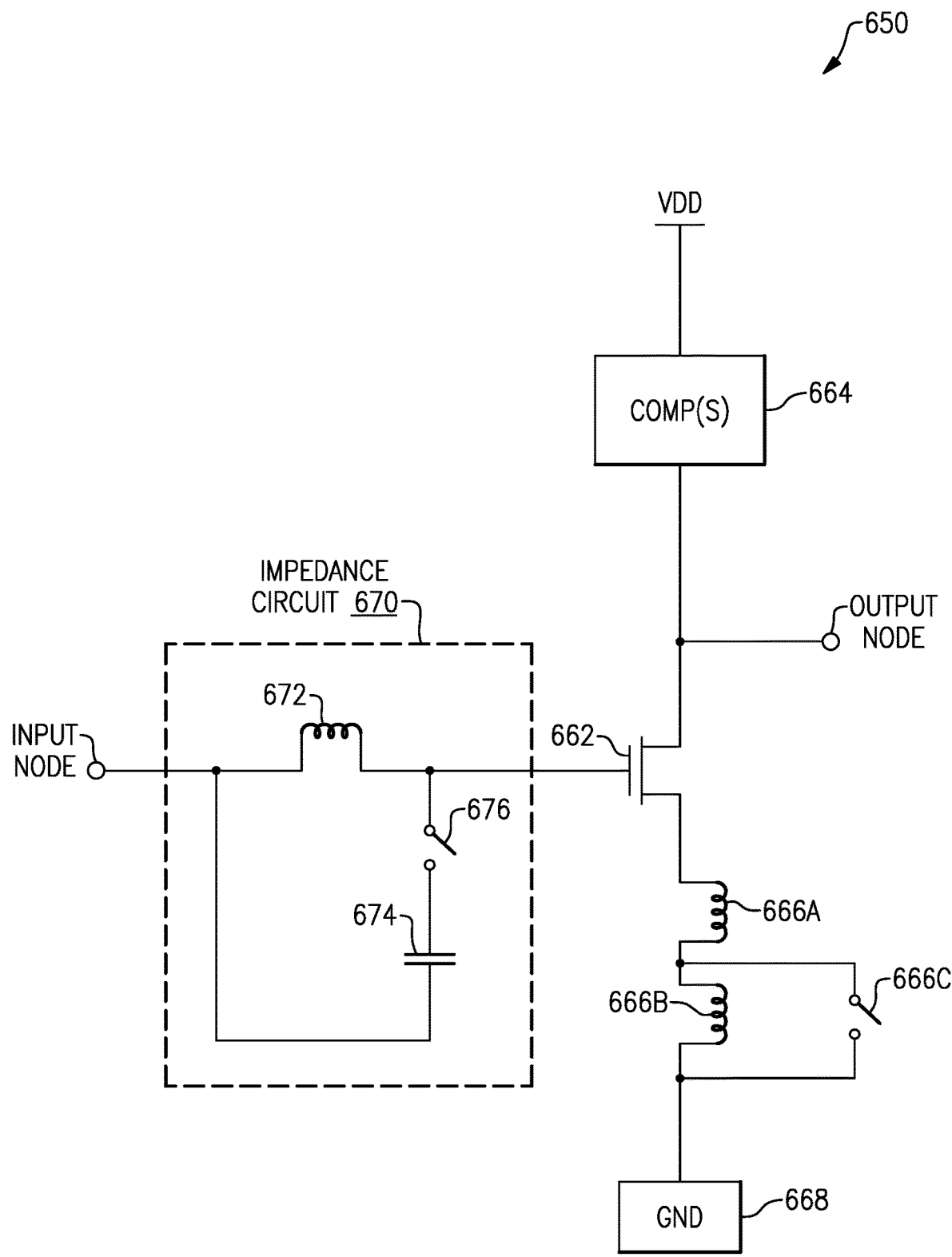
FIG. 6 an example amplifier with an impedance circuit and a degeneration circuit that includes multiple inductors in accordance with one or more embodiments.

FIG. 6 an example amplifier 650 with an impedance circuit 670 and a degeneration circuit that includes multiple inductors in accordance with one or more embodiments. Here, the amplifier 650 can receive an input signal at an input node and provide an output signal at an output node. The amplifier 650 includes a transistor 662 to amplify the input signal. The transistor 662 includes a gate or a base coupled to the input node and the impedance circuit 670, a drain or a collector coupled to the output node and one or more components 664, and a source or an emitter coupled to a degeneration circuit that includes components 666. The transistor 662 can be coupled to a ground pad 668 via the components 666. The impedance circuit 670 can include an inductor 672 and a switching-capacitive arm coupled in parallel to the inductor 672. The switching-capacitive arm can include a capacitor 674 and a switch 676 coupled in series, as illustrated. In some embodiments, the amplifier 650 is implemented as a variable-gain amplifier configured for different gain modes.

In this example, the degeneration circuit includes a first inductor 666A coupled to a second inductor 666B and a switch 666C. The switch 666C can include a transistor, a mechanical switch, or another type of switch. The switch 666C can be enabled or disabled to change a degeneration inductance for the amplifier 650, such as to operate for different gain modes. For example, the switch 666C can be controlled to operate in a closed state when the amplifier 650 is operating in a first gain mode (e.g., a high-gain mode), and can be controlled to operate in an open state when the amplifier 650 is operating in a second gain mode (e.g., a low-gain mode). The degeneration circuit can be controlled to increase performance of the amplifier 650 (in comparison to other amplifiers) by increasing linearity, reducing noise, helping with stability, and/or lowering input reflections, for example. As such, the amplifier 650 can achieve targeted or improved performance by using the degeneration circuit that is configurable to provide tailored inductances for different gain modes. Although the degeneration circuit is coupled to a source or an emitter of the transistor 662 in the example of FIG. 6, the degeneration circuit can be coupled to other portions of the transistor 662, such as the gate, the drain/collector, the body, etc.

Figure 7:
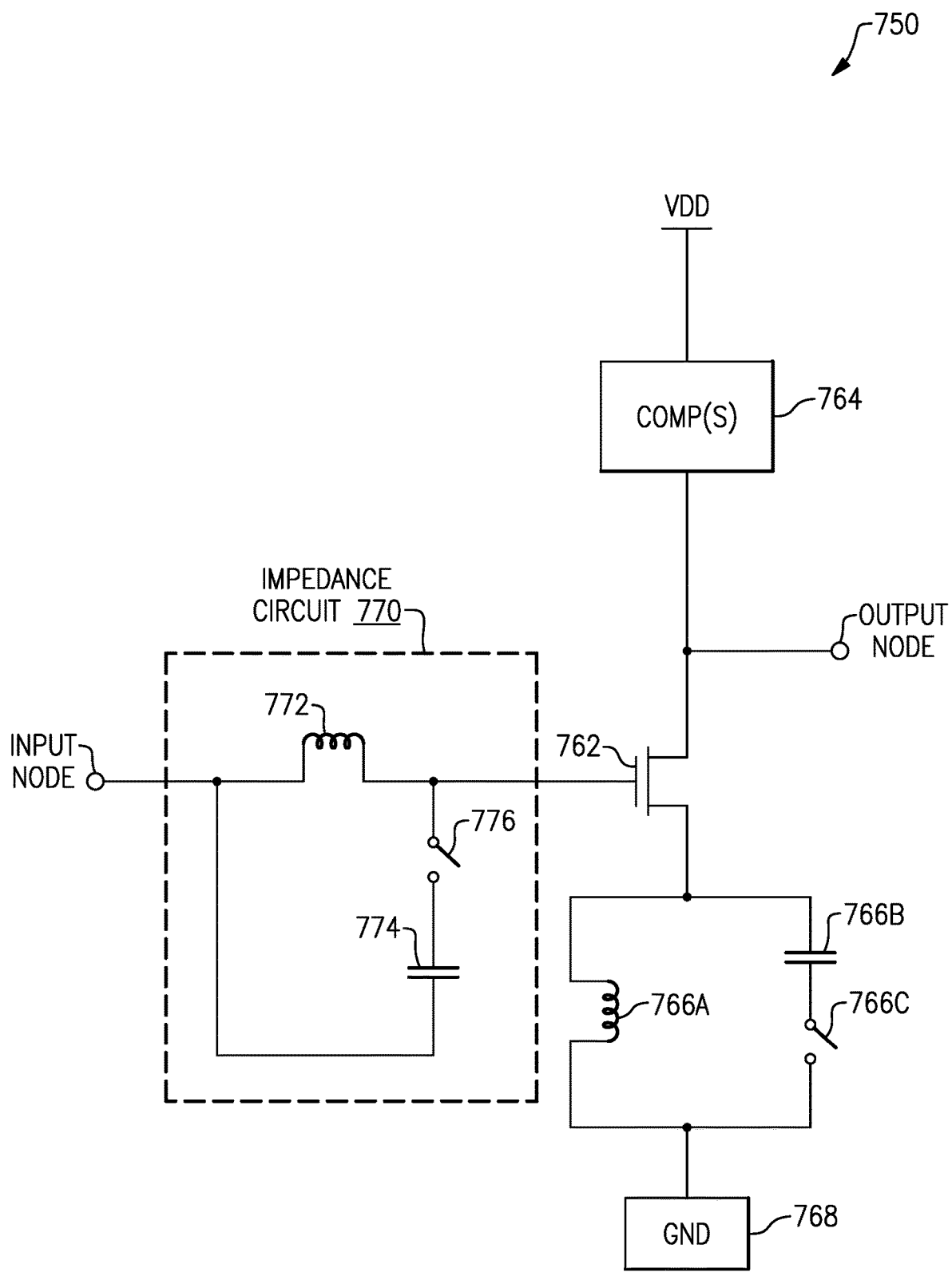
FIG. 7 an example amplifier with an impedance circuit and a degeneration circuit that includes an inductor and a capacitor in accordance with one or more embodiments.

FIG. 7 an example amplifier 750 with an impedance circuit 770 and a degeneration circuit that includes an inductor and a capacitor in accordance with one or more embodiments. Here, the amplifier 750 can receive an input signal at an input node and provide an output signal at an output node. The amplifier 750 includes a transistor 762 to amplify the input signal. The transistor 762 includes a gate or a base coupled to the input node and the impedance circuit 770, a drain or a collector coupled to the output node and one or more components 764, and a source or an emitter coupled to a degeneration circuit that includes components 766. The transistor 762 can be coupled to a ground pad 768 via the components 766. The impedance circuit 770 can include an inductor 772 and a switching-capacitive arm coupled in parallel to the inductor 772. The switching-capacitive arm can include a capacitor 774 and a switch 776 coupled in series, as illustrated. In some embodiments, the amplifier 750 is implemented as a variable-gain amplifier configured for different gain modes.

In this example, the degeneration circuit includes an inductor 766A coupled in parallel to a capacitor 766B and a switch 766C. The switch 766C can include a transistor, a mechanical switch, or another type of switch. The switch 766C can be enabled or disabled to change a degeneration inductance for the amplifier 650, such as to operate for different gain modes. For example, the switch 766C can be controlled to operate in an open state when the amplifier 750 is operating in a first gain mode (e.g., a high-gain mode), and can be controlled to operate in a closed state when the amplifier 750 is operating in a second gain mode (e.g., a low-gain mode). The degeneration circuit can be controlled to increase performance of the amplifier 750 (in comparison to other amplifiers) by increasing linearity, reducing noise, helping with stability, and/or lowering input reflections, for example. As such, the amplifier 750 can achieve targeted or improved performance by using the degeneration circuit that is configurable to provide tailored inductances for different gain modes. Although the degeneration circuit is coupled to a source or an emitter of the transistor 762 in the example of FIG. 7, the degeneration circuit can be coupled to other portions of the transistor 762, such as the gate, the drain/collector, the body, etc.

Figure 8:
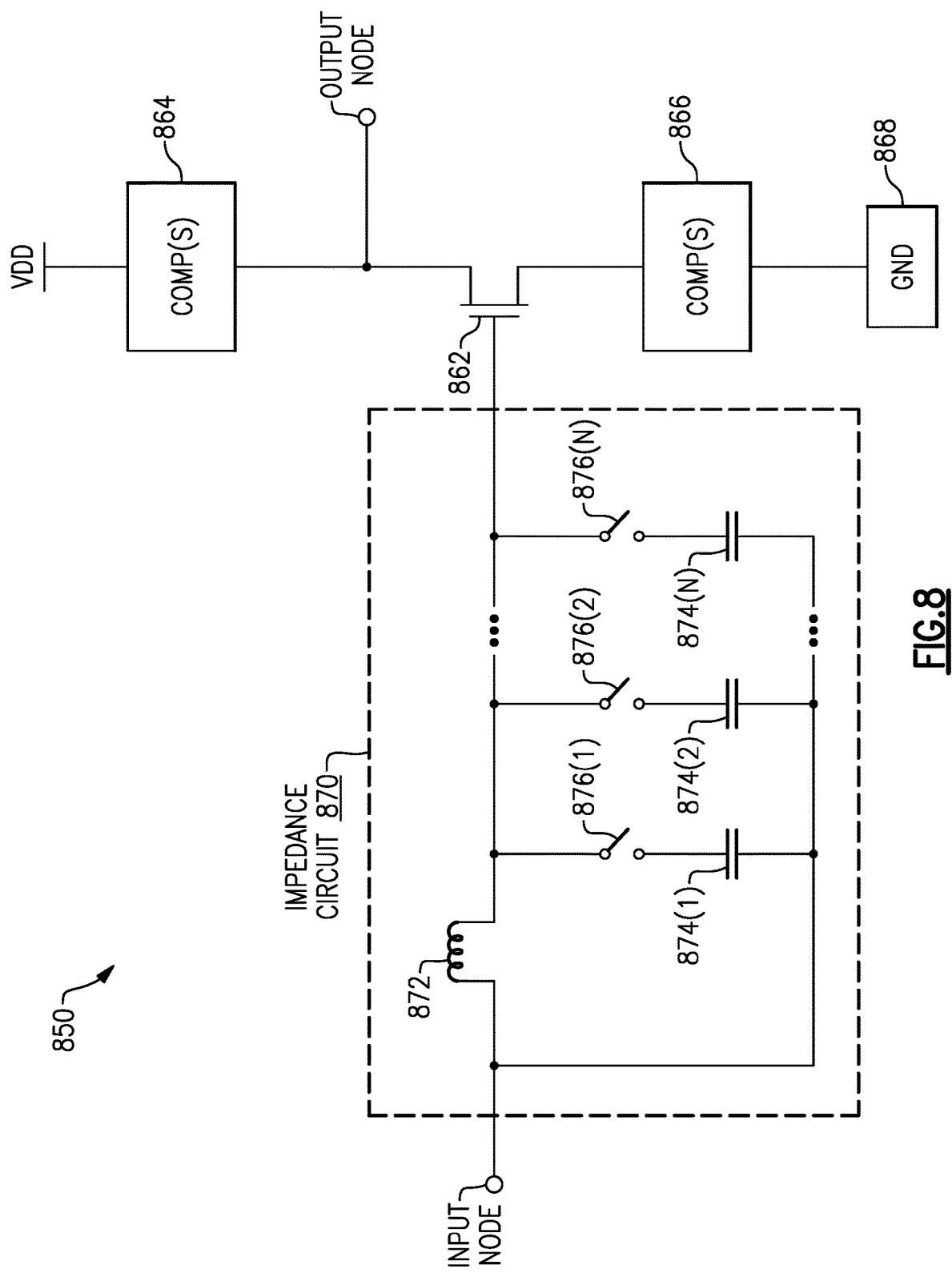
FIG. 8 illustrates an example amplifier with an impedance circuit that includes multiple switching-capacitive arms in accordance with one or more embodiments.

FIG. 8 illustrates an example amplifier 850 with an impedance circuit 870 that includes multiple switching-capacitive arms in accordance with one or more embodiments. Here, the amplifier 850 can receive an input signal at an input node and provide an output signal at an output node. The amplifier 850 includes a transistor 862 to amplify the input signal. The transistor 862 includes a gate or a base coupled to the input node and the impedance circuit 870, a drain or a collector coupled to the output node and one or more components 864, and a source or an emitter coupled to one or more components 866. The transistor 862 can be coupled to a ground pad 868 via the one or more components 866. The one or more components 864 and/or the one or more components 866 can include one or more inductors, one or more capacitors, one or more transistors, or other components. In some embodiments, the amplifier 850 is implemented as a variable-gain amplifier configured for different gain modes.

The impedance circuit 870 can include an inductor 872 and multiple switching-capacitive arms coupled in parallel to the inductor 872 and each other. The switching-capacitive arms include capacitors 874(1)-874(N) and switches 876(1)-876(N). In particular, each switching-capacitive arm includes a capacitor 874 and a transistor 876 coupled in series. In some embodiments, the multiple switching-capacitive arms can be implemented to more finely tune the amplifier 850 and/or to tune the amplifier 850 to more gain modes, in comparison to other amplifiers. For example, the amplifier 850 can be implemented with five to eight gain modes, with the impedance circuit 870 including four to seven switching-capacitive arms for the gain modes. In other examples, any number of gain modes can be implemented with any number of switching-capacitive arms.

Figure 9:
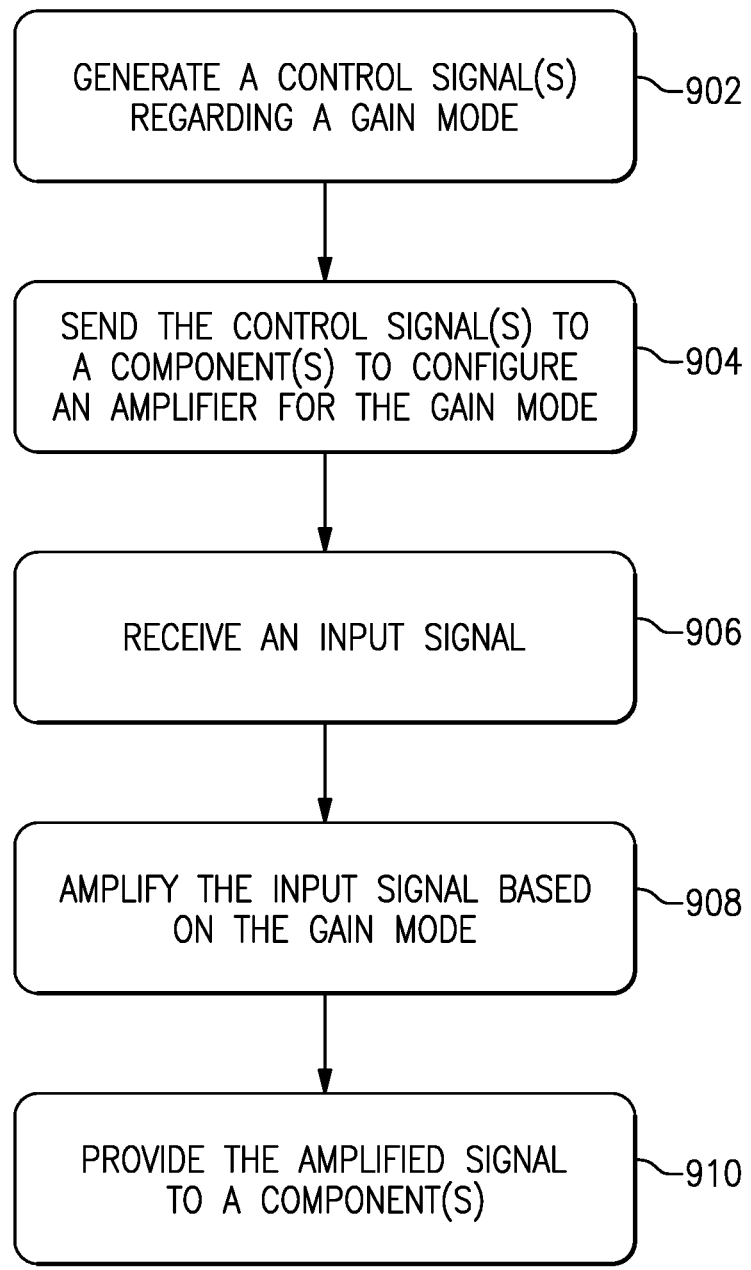
FIG. 9 illustrates an example flow diagram of a process of controlling an amplifier in accordance with one or more embodiments.

FIG. 9 illustrates an example flow diagram of a process 900 of controlling an amplifier in accordance with one or more embodiments. The process 900 can be implemented by any of the components discussed herein, such as any component of a radio-frequency device.

At 902, a control signal(s) regarding a gain mode can be generated. For example, a controller can generate a control signal indicating a gain mode and/or an impedance (e.g., input impedance, degeneration inductance, etc.) to implement for the gain mode. The controller can generate the control signal based on a variety of factors, such as a QoS metric, a signal from another component, etc.

At 904, the control signal(s) can be sent to one or more components to configure an amplifier for the gain mode. For example, a controller can send a control signal to one or more components of an amplifier, such as an impedance circuit, a degeneration circuit, and/or a supply voltage component, to configure the one or more components of the amplifier to implement a gain mode that is selected for operation. The control signal can configure a component of the amplifier by setting a supply voltage, biasing a transistor of an impedance or degeneration circuit to an on or off state, etc. As such, an impedance circuit of a variable-gain amplifier can be configured to provide a tailored amount of impedance for a gain mode.

At 906, an input signal can be received. For example, an amplifier can receive a signal from an antenna. Alternatively, or additionally, an amplifier can receive a signal from a transceiver or another component of a radio-frequency device of the amplifier.

At 908, the input signal can be amplified based on the gain mode. For example, an amplifier that is configured for the gain mode, such as with a tailored amount of input impedance and/or degeneration inductance, can amplify the input signal with an amplification amount that is associated with the gain mode.

At 910, the amplified signal can be provided to one or more components. For example, a variable-gain amplifier can provide an amplified signal as an output signal to one or more components of a radio-frequency device associated with the amplifier. For instance, the amplified signal can be provided to a transceiver of the radio-frequency device, an antenna of the radio-frequency device, and so on.

Figure 10:
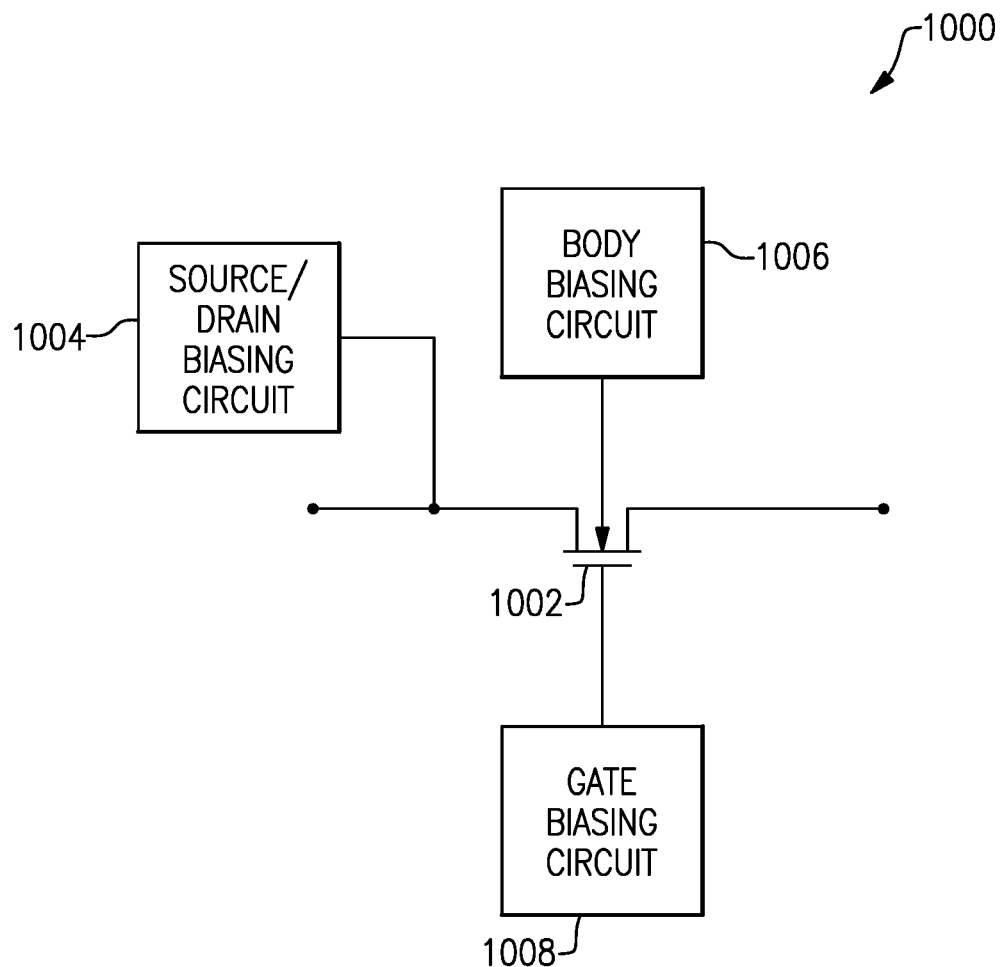
FIG. 10 illustrates example biasing circuitry for a transistor in accordance with one or more embodiments.

FIG. 10 illustrates example biasing circuitry 1000 for a transistor 1002 in accordance with one or more embodiments. The transistor 1002 can be representative of any of the transistors discussed herein. That is, any of the transistors discussed herein can be biased in a similar manner as that of the example biasing circuitry 1000 of the transistor 1002. As such, although not illustrated in some cases, any of the transistors discussed herein can be connected to any number of biasing circuits to control the transistors.

In the example of FIG. 10, a source and/or a drain of the transistor 1002 is connected to a source/drain biasing circuit 1004 that applies a biasing voltage to the source and/or the drain of the transistor 1002, a body of the transistor 1002 is connected to a body biasing circuit 1006 that applies a biasing voltage to the body of the transistor 1002, and a gate of the transistor 1002 is connected to a gate biasing circuit 1008 that applies a biasing voltage to the gate of the transistor 1002. The source/drain biasing circuit 1004, the body biasing circuit 1006, and/or the gate biasing circuit 1008 can apply voltages that are more or less than a value to control the transistor 1002 (e.g., place the transistor in an on or off state). In some embodiments, the source/drain biasing circuit 1004, the body biasing circuit 1006, and/or the gate biasing circuit 1008 are implemented as a controller.

Further, in some embodiments, the transistor 1002 is implemented as a transistor stack that includes multiple transistors connected in series.

Figure 11:
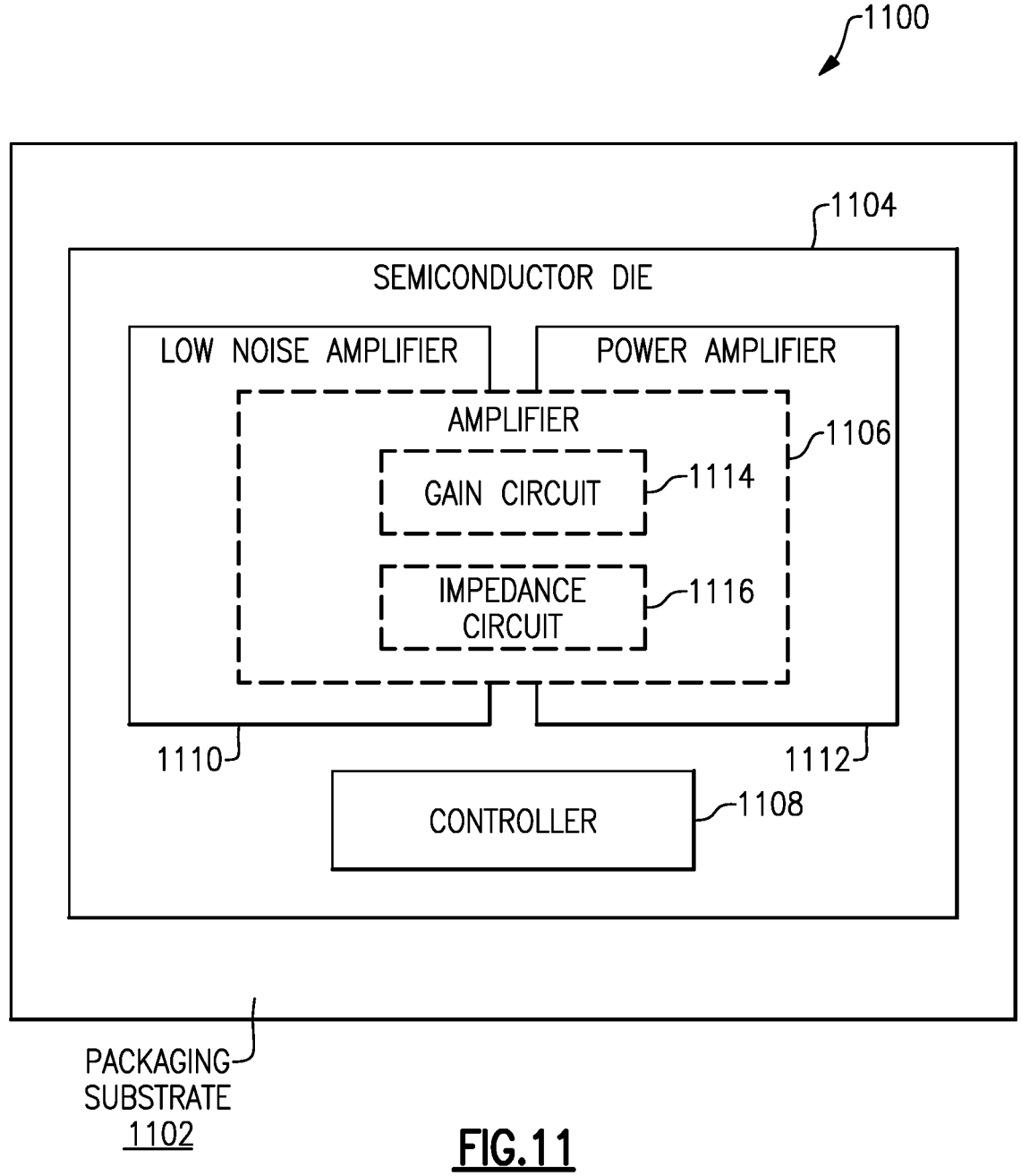
FIG. 11 illustrates an example radio-frequency module in accordance with one or more embodiments.

FIG. 11 illustrates an example radio-frequency module 1100 in accordance with one or more embodiments. The radio-frequency module 1100 includes a packaging substrate 1102, a semiconductor die 1104 mounted on the packaging substrate 1102, an amplifier 1106 implemented on the semiconductor die 1104, and a controller 1108 implemented on the semiconductor die 1104. The amplifier 1106 can include any of the amplifiers discussed herein. Similarly, the controller 1108 can include any of the controllers discussed herein. In some embodiments, the amplifier 1106 is implemented within a low noise amplifier (LNA) 1110 provided on the semiconductor die 1104. Alternatively, or additionally, the amplifier 1106 is implemented within a power amplifier (PA) 1112. The amplifier 1106 can also be implemented within other amplifiers. Further, in some embodiments, multiple amplifiers are implemented within different components (e.g., a first amplifier is implemented within the LNA 1110 and a second amplifier is implemented within the PA 1112). Although illustrated as separate components, in some cases the controller 1108 is implemented as part of the amplifier 1106. In some embodiments, the radio-frequency module 1100 can be a front-end module (FEM).

As shown, the amplifier 1106 can include a gain circuit 1114 coupled to an impedance circuit 1116. Although the gain circuit 1114 and the impedance circuit 1116 are illustrated as being implemented on the same semiconductor die and packaging substrate, in some embodiments the gain circuit 1114 and the impedance circuit 1116 are implemented on different semiconductor dies and/or packaging substrates. For example, the gain circuit 1114 can be implemented on a first semiconductor die and the impedance circuit 1116 can be implemented on a second semiconductor die. In some embodiments, a capacitor and/or an inductor of the impedance circuit 1116 can be surface mounted. Further, in some embodiments, the controller 1108 and the amplifier 1106 can be implemented on different semiconductor dies and/or packaging substrates.

Figure 12:
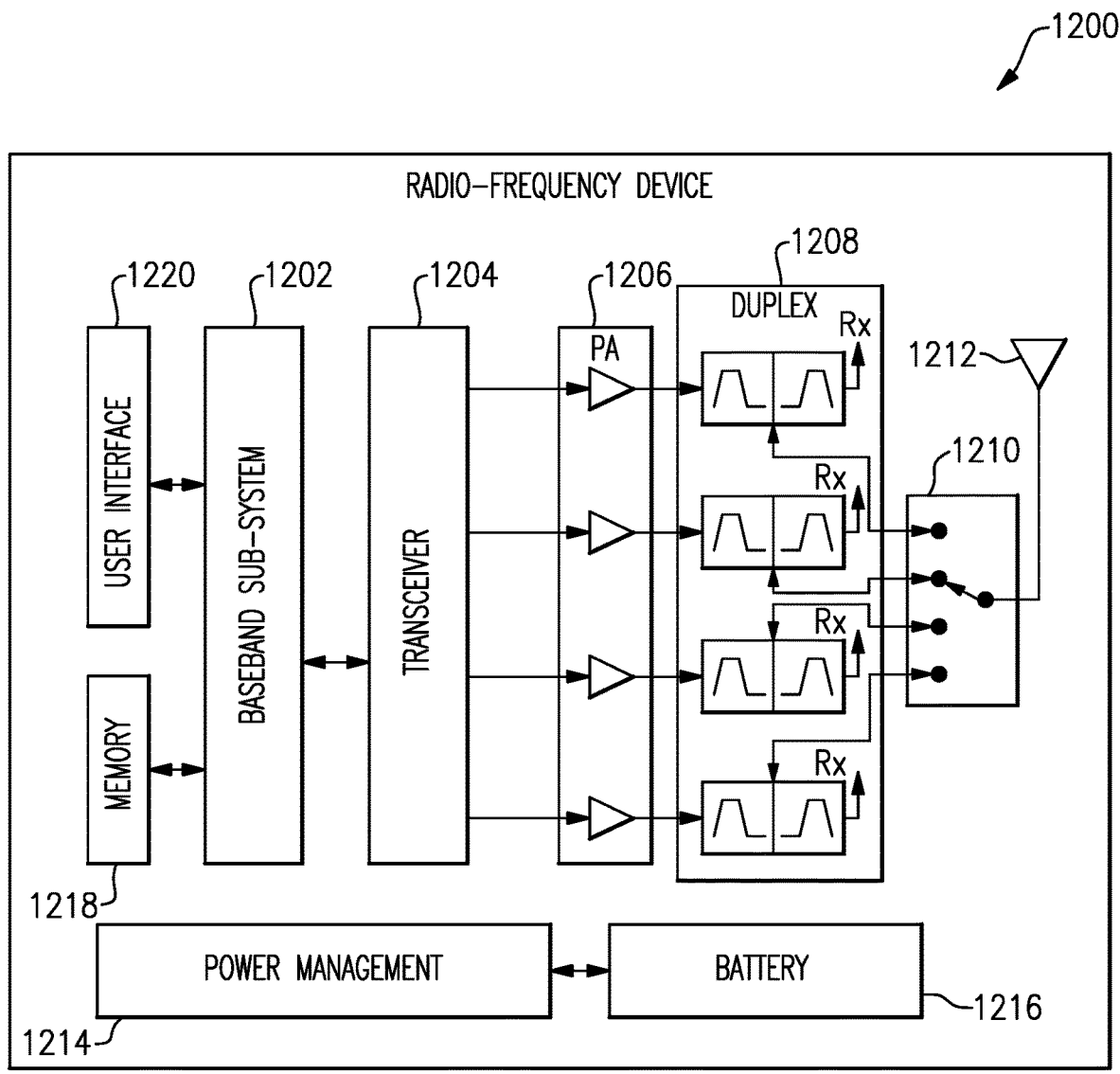
FIG. 12 illustrates an example radio-frequency device in accordance with one or more embodiments.

FIG. 12 illustrates an example radio-frequency device 1200 in accordance with one or more embodiments. As shown, the radio-frequency device 1200 can include a baseband sub-system 1202, a transceiver 1204, a power amplifier (PA) module 1206, a duplexer 1208, a switch 1210, one or more antennas 1212, a power management system 1214, a battery 1216, a memory 1218, and a user interface 1220. The baseband sub-system 1202, the transceiver 1204, the PA module 1206, the duplexer 1208, the switch 1210, one or more antennas 1212, the power management system 1214, the battery 1216, the memory 1218, and/or the user interface 1220 can be in communication with each other.

The baseband sub-system 1202 can be connected to the user interface 1220 to facilitate various input and/or output of voice and/or data provided to and/or received from a user. The baseband sub-system 1202 can also be connected to the memory 1218 that is configured to store data and/or instructions to facilitate operation of the radio-frequency device 1200 and/or to provide storage of information for a user.

The transceiver 1204 can generate radio-frequency (RF) signals for transmission and/or process incoming RF signals received from the one or more antennas 1212. The transceiver 1204 can interact with the baseband sub-system 1202 that is configured to provide conversion between data and/or voice signals suitable for a user and/or RF signals suitable for the transceiver 1204. The transceiver 1204 can also be connected to the power management system 1214.

The PA module 1206 can include a plurality of PAs that can provide an amplified RF signal to the switch 1210 (e.g., via the duplexer 1208). The PA module 1206 can also receive an unamplified RF signal from the transceiver 1204. In examples, the duplexer 1208 can allow transmit and/or receive operations to be performed simultaneously using a common antenna. In FIG. 12, received signals are shown to be routed to "Rx" paths that can include, for example, a low-noise amplifier (LNA). In some embodiments, any of the amplifiers discussed herein are implemented within an LNA, the PA module 1206, or another component.

The switch 1210 can route an RF signal to and/or from the one or more antennas 1212. The switch 1210 can include any number of poles and/or throws. In examples, the switch 1210 is implemented on a module. The module can include a packaging substrate configured to receive a plurality of components. Although one switch 1210 is illustrated in the example of FIG. 12, any number of switches can be implemented on the radio-frequency device 1200.

The one or more antennas 1212 can include antennas for transmitting and/or receiving signals associated with a wide variety of frequencies and communications standards. In examples, the one or more antennas 1212 support Multiple-Input Multiple-output (MIMO) communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity can refer to communications in which a particular antenna is selected for operation at a particular time. For example, a switch can be used to select a particular antenna from a group of antennas based on a variety of factors, such as an observed bit error rate and/or a signal strength indicator. In examples, the one or more antennas 1212 can include a diversity antenna.

The power management system 1214 can be configured to manage power for operation of the radio-frequency device 1200. The power management system 1214 can provide power to any number of components of the radio-frequency device 1200. The power management system 1214 can receive a battery voltage from the battery 1216. The battery 1216 can be any suitable battery for use in the radio-frequency device 1200, including, for example, a lithium-ion battery.

The radio-frequency device 1200 can communicate using a wide variety of communications technologies, including, but not limited to, 2G, 3G, 4G (including Long Term Evolution (LTE), LTE-Advanced, and LTE-Advanced Pro), 5G, Wireless Local Area Network (WLAN) (for instance, Wi-Fi), Wireless Personal Area Network (WPAN) (for instance, Bluetooth and ZigBee), Wireless Metropolitan Area Network (WMAN) (for instance, WiMax), and/or satellite-based radio navigation systems (for instance, Global Positioning System (GPS) technologies).

The radio-frequency device 1200 can operate with beamforming in certain implementations. For example, the radio-frequency device 1200 can include phase shifters having variable phase controlled by the transceiver 1204. Additionally, the phase shifters can be controlled to provide beam formation and directivity for transmission and/or reception of signals using the one or more antennas 1212. For example, in the context of signal transmission, the phases of the transmit signals provided to the one or more antennas 1212 are controlled such that radiated signals from the one or more antennas 1212 combine using constructive and destructive interference to generate an aggregate transmit signal exhibiting beam-like qualities with more signal strength propagating in a given direction. In the context of signal reception, the phases are controlled such that more signal energy is received when the signal is arriving to the one or more antennas 1212 from a particular direction. In some embodiments, the one or more antennas 1212 include one or more arrays of antenna elements to enhance beamforming.

In examples, the radio-frequency device 1200 supports carrier aggregation, thereby providing flexibility to increase peak data rates. Carrier aggregation can be used for both Frequency Division Duplexing (FDD) and Time Division Duplexing (TDD) and can be used to aggregate a plurality of carriers or channels. Carrier aggregation includes contiguous aggregation, in which contiguous carriers within the same operating frequency band are aggregated. Carrier aggregation can also be non-contiguous and can include carriers separated in frequency within a common band or in different bands.

The radio-frequency device 1200 can include a wide variety of devices that are configured to communicate wirelessly. For example, the radio-frequency device 1200 can include a cellular phone, a smart-phone, a hand-held wireless device with or without phone functionality, a wireless tablet, a smart appliance, a smart vehicle, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wearable device (e.g., a watch), a clock, etc.

The detailed description is set forth with reference to the accompanying figures. In the figures, the left-most digit(s) of a reference number identifies the figure in which the reference number first appears. The use of the same reference numbers in different figures indicates similar or identical items.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Components discussed herein can be coupled in a variety of manners, such as through a conductive material. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word can cover all of the following interpretations of the word: any of the items in the list, all of the items in the list, and any combination of the items in the list.

The above description of embodiments of the disclosure is not intended to be exhaustive or to limit the disclosure to the precise form disclosed above. While specific embodiments, and examples, are described above for illustrative purposes, various equivalent modifications are possible within the scope of the disclosure, as those skilled in the relevant art will recognize. For example, while processes or blocks can be presented in a given order, alternative embodiments can perform routines having steps, or employ systems having blocks, in a different order, and some processes or blocks can be deleted, moved, added, subdivided, combined, and/or modified. Each of these processes or blocks can be implemented in a variety of different ways. Also, while processes or blocks are at times shown as being performed in series, these processes or blocks can instead be performed in parallel or can be performed at different times.

The features described herein can be applied to other systems, not necessarily the system described above. The elements and acts of the various embodiments described above can be combined to provide further embodiments.

In some embodiments, the methods and/or systems discussed herein can be implemented at least in part by control circuitry and/or memory. For example, memory can store executable instructions that, when executed by control circuitry, cause the control circuitry to perform operations discussed herein. To illustrate, in some embodiments of the process of FIG. 9, a device can include memory and control circuitry, wherein the memory can store executable instructions that, when executed by the control circuitry, cause the control circuitry to perform, at least in part, any of the operations of the process of FIG. 9. Additionally, or alternatively, other methods and/or systems discussed herein can be implemented at least in part with control circuitry and memory storing executable instructions.

Control circuitry can include one or more processors, such as one or more central processing units (CPUs), one or more microprocessors, one or more graphics processing units (GPUs), one or more digital signal processors (DSPs), and/or other processing circuitry. Alternatively, or additionally, control circuitry can include one or more application specific integrated circuits (ASIC), one or more field-programmable gate arrays (FPGAs), one or more program-specific standard products (ASSPs), one or more complex programmable logic devices (CPLDs), and/or the like. Control circuitry can be configured to execute one or more instructions stored in memory to thereby perform one or more operations to implement various functionality discussed herein.

Memory can include any suitable or desirable type of computer-readable media. For example, computer-readable media can include one or more volatile data storage devices, non-volatile data storage devices, removable data storage devices, and/or nonremovable data storage devices implemented using any technology, layout, and/or data structure(s)/protocol, including any suitable or desirable computer-readable instructions, data structures, program modules, or other types of data. Computer-readable media that may be implemented in accordance with embodiments of the present disclosure includes, but is not limited to, phase change memory, static random-access memory (SRAM), dynamic random-access memory (DRAM), other types of random access memory (RAM), read-only memory (ROM), electrically erasable programmable read-only memory (EEPROM), flash memory or other memory technology, compact disk read-only memory (CD-ROM), digital versatile disks (DVD) or other optical storage, magnetic cassettes, magnetic tape, magnetic disk storage or other magnetic storage devices, or any other non-transitory medium that can be used to store information for access by a computing device. As used in certain contexts herein, computer-readable media may not generally include communication media, such as modulated data signals and carrier waves. As such, computer-readable media should generally be understood to refer to non-transitory media.

While some embodiments have been described, these embodiments have been presented by way of example only, and are not intended to limit the scope of the disclosure. Indeed, the methods and systems described herein can be embodied in a variety of other forms; furthermore, various omissions, substitutions and changes in the form of the methods and systems described herein can be made without departing from the spirit of the disclosure. Claims and their equivalents are intended to cover such forms or modifications as would fall within the scope and spirit of the disclosure.

What is claimed is:

1. A variable-gain amplifier comprising:
a gain circuit configured to amplify a signal, the gain circuit including a first transistor having a gate or a base coupled to an input node, the gain circuit being configured to selectively operate in a first gain mode based on a first amount of supply voltage and a second gain mode based on a second amount of supply voltage, the first transistor being implemented to amplify the signal in both the first gain mode and the second gain mode; and
an impedance circuit coupled to the first transistor at a single connection that is the gate or the base of the first transistor, the impedance circuit including an inductor and a switching-capacitive arm coupled in parallel to the inductor, the switching-capacitive arm including a capacitor and a switch coupled in series, the impedance circuit being configurable to (i) a first state, for the first gain mode, that includes the switch in an open state and the inductor connected in series with the input node and the gate or the base of the first transistor, and (ii) a second state, for the second gain mode, that includes the switch in a closed state and the inductor and the capacitor connected with the input node and the gate or the base of the first transistor.

2. An amplifier comprising:
a transistor including a gate or a base coupled to an input node and a drain or a collector coupled to an output node, the transistor being configured to selectively operate in a first gain mode based on a first amount of voltage and a second gain mode based on a second amount of voltage; and
a circuit coupled between the input node and the gate or the base of the transistor without being coupled to a source or an emitter of the transistor, the circuit including an inductor and a switching-capacitive arm coupled in parallel to the inductor, the switching-capacitive arm including a capacitor and a switch coupled in series, the circuit being configured to (i) a first state for the first gain mode that includes the switch in an open state and the inductor included on a signal path between the input node and the gate or the base of the transistor, and (ii) a second state for the second gain mode that includes the switch in a closed state and the inductor and the capacitor included on the signal path between the input node and the gate or the base of the transistor, the transistor being configured to amplify a signal in the first gain mode and the second gain mode.

3. The variable-gain amplifier of claim 1 wherein the switch includes at least one of a second transistor or a mechanical switch.

4. The variable-gain amplifier of claim 1 wherein the switching-capacitive arm is a first switching-capacitive arm and the impedance circuit further includes a second switching-capacitive arm coupled in parallel to the inductor.

5. The variable-gain amplifier of claim 1 wherein the impedance circuit is coupled between the input node and the gate or the base of the first transistor.

6. The variable-gain amplifier of claim 1 wherein the variable-gain amplifier is implemented within a low noise amplifier.

7. A radio-frequency module comprising:
a low noise amplifier configured to amplify a first signal;
a power amplifier configured to amplify a second signal; and
a controller coupled to at least one of the low noise amplifier or the power amplifier, the controller being configured to select a first gain mode or a second gain mode for the radio-frequency module by causing a change in a supply voltage,
wherein at least one of the low noise amplifier or the power amplifier includes a transistor and an impedance circuit, the transistor including a gate or a base coupled to an input node and a drain or a collector coupled to an output node, the impedance circuit being coupled to the gate or the base of the transistor without being coupled to a source or an emitter of the transistor, the impedance circuit including an inductor and a switching-capacitive arm coupled in parallel to the inductor, the switching-capacitive arm including a capacitor and a switch coupled in series, the impedance circuit being configurable to (i) a first state, for the first gain mode, that includes the switch in an open state and the inductor on a signal path between the input node and the gate or the base of the transistor, and (ii) a second state, for the second gain mode, that includes the switch in a closed state and the inductor and the capacitor on the signal path between the input node and the gate or the base of the transistor, the transistor being part of the signal path in the first gain mode and the second gain mode.

8. The amplifier of claim 2 wherein the first gain mode is associated with more gain than the second gain mode.

9. The radio-frequency module of claim 7 wherein the switching-capacitive arm is a first switching-capacitive arm and the impedance circuit further includes a second switching-capacitive arm coupled in parallel to the inductor.

10. The amplifier of claim 2 wherein the switch includes another transistor.

11. The amplifier of claim 2 wherein the switch includes a mechanical switch.

12. The amplifier of claim 2 wherein the amplifier is implemented within a low noise amplifier and the transistor is implemented as a field-effect transistor.

13. The amplifier of claim 2 further comprising a degeneration circuit coupled to the source or the emitter of the transistor, the degeneration circuit including at least one inductor.

14. The radio-frequency module of claim 7 wherein the low noise amplifier includes the transistor and the impedance circuit.

15. The radio-frequency module of claim 7 wherein the controller is configured to place the switch in the open state in response to selecting the first gain mode and place the switch in the closed state in response to selecting the second gain mode.

16. The radio-frequency module of claim 7 wherein the first gain mode is associated with more gain than the second gain mode.

17. The radio-frequency module of claim 7 wherein the power amplifier includes the transistor and the impedance circuit.

* * * * *